US012198745B2

(12) United States Patent
Yano (10) Patent No.: US 12,198,745 B2
(45) Date of Patent: *Jan. 14, 2025

(54) SEMICONDUCTOR STORAGE DEVICE AND WRITING METHOD THEREOF

(71) Applicant: Winbond Electronics Corp., Taichung (TW)

(72) Inventor: Masaru Yano, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 212 days.

This patent is subject to a terminal disclaimer.

(21) Appl. No.: 17/736,995

(22) Filed: May 4, 2022

(65) Prior Publication Data

US 2022/0406353 A1 Dec. 22, 2022

(30) Foreign Application Priority Data

Jun. 16, 2021 (JP) ................................. 2021-099965

(51) Int. Cl.
*G11C 11/00* (2006.01)
(52) U.S. Cl.
CPC .................................. *G11C 11/005* (2013.01)
(58) Field of Classification Search
CPC .............. G11C 11/005; G11C 13/0026; G11C 13/0028; G11C 13/004; G11C 13/0069; G11C 16/0466; G11C 16/08; G11C 16/14; G11C 16/24; G11C 16/26; G11C 16/0483; G11C 13/003; H10B 43/30; H10B 63/00; H10B 63/30; H10B 63/80
See application file for complete search history.

(56) References Cited

U.S. PATENT DOCUMENTS

| 8,934,280 | B1 | 1/2015 | Kuo et al. |
| 9,330,773 | B2 | 5/2016 | Lim et al. |
| 2020/0251167 | A1 | 8/2020 | Siau et al. |
| 2022/0383919 | A1* | 12/2022 | Yano ................ H10B 63/30 |
| 2023/0170021 | A1* | 6/2023 | Yano ................ G11C 13/0038 |

FOREIGN PATENT DOCUMENTS

| CN | 109427400 | 3/2019 |
| JP | 2012038393 | 2/2012 |
| TW | 201205580 | 2/2012 |

OTHER PUBLICATIONS

"Office Action of Korea Counterpart Application", issued on Oct. 13, 2023, with English translation thereof, p. 1-p. 9.

* cited by examiner

*Primary Examiner* — Hien N Nguyen
(74) *Attorney, Agent, or Firm* — JCIPRNET (57) ABSTRACT

A semiconductor storage device and its writing method are provided. A memory cell array is formed on a substrate, and the memory cell array has an NOR array with an NOR flash memory structure and a resistive random access array with a resistive random access memory (RRAM) structure. A read/write control unit charges a selected global bit line when a set write operation is performed on a selected memory cell of the resistive random access array, and a set write voltage is applied to the selected memory cell by applying a voltage charging the selected global bit line.

23 Claims, 9 Drawing Sheets

SEMICONDUCTOR STORAGE DEVICE AND WRITING METHOD THEREOF

CROSS-REFERENCE TO RELATED APPLICATION

This application claims the priority benefit of Japan application serial no. 2021-099965, filed on Jun. 16, 2021. The entirety of the above-mentioned patent application is hereby incorporated by reference herein and made a part of this specification.

BACKGROUND

Technical Field

The disclosure relates to a semiconductor storage device where a Not-OR (NOR) flash memory and a resistive random access memory (RRAM) are integrated.

Description of Related Art

A NOR flash memory is a non-volatile memory capable of performing a random access operation on a memory cell by arranging the memory cell between a bit line and a source line.

On the other hand, in a RRAM, which acts as a non-volatile memory replacing the NOR flash memory and applies a resistive random access element, a pulse voltage is applied to the resistive random access element, so that the resistive random access element is turned to be in a high resistance state (HRS) or a low resistance state (LRS) in a reversible and non-volatile manner to store data.

Unlike the NOR flash memory, the RRAM does not require any erase operation, and therefore data may be rewritten with a low voltage. However, the size of the memory cell of the RRAM is not as competitive as that of a NOR memory cell, and if the integration level is increased, the cost performance accordingly decreases.

SUMMARY

The disclosure provides a semiconductor storage device with a high integration level and low power consumption.

According to an embodiment of the disclosure, a semiconductor storage device is provided, and the semiconductor storage device includes: a memory cell array, having a first memory cell array with a RRAM structure and a second memory cell array with a NOR flash memory structure on one substrate, a plurality of global bit lines extending along a column direction of the memory cell array and shared by the first memory cell array and the second memory cell array, and a read/write control unit performing a read/write operation on a selected memory cell in the first memory cell array or the second memory cell array. Here, the read/write control unit applies a set write voltage to the selected memory cell by applying a write voltage charging a selected global bit line of the global bit lines.

In an embodiment, the semiconductor storage device further includes a connection member selectively connecting the global bit lines to the first memory cell array at a border of the first memory cell array and the second memory cell array, and the connection member applies the set write voltage to the selected memory cell based on the voltage charging the selected global bit line. In an embodiment, the read/write control unit enables the selected global bit line to be in a floating state after charging the selected global bit line, and the connection member electrically connects the selected global bit line in the floating state to a local bit line. In an embodiment, the connection member includes a plurality of transistors connecting one of the global bit lines to a plurality of local bit lines, respectively, the connection member connects the selected global bit line to a selected local bit line of the local bit lines by turning on a selected transistor of the transistors, and the selected transistor generates the set write voltage. In an embodiment, a clamping voltage for generating the set write voltage is applied to a gate of the selected transistor, and the voltage charging the selected global bit line is greater than the clamping voltage. In an embodiment, the memory cell includes a resistive random access element and an access transistor connected to the resistive random access element, a gate of the access transistor is connected to a word line, and when the access transistor is turned on, the set write voltage is applied to the resistive random access element. In an embodiment, when the read/write control unit performs a reset write operation on the selected memory cell, a reset write voltage is applied to a source line, and a ground voltage is applied to the selected global bit line.

According to an embodiment of the disclosure, a writing method of a semiconductor storage device is provided, and the semiconductor storage device includes: a memory cell array having a first memory cell array with a RRAM structure and a second memory cell array with a NOR flash memory structure on one substrate and a plurality of global bit lines extending along a column direction of the memory cell array and shared by the first memory cell array and the second memory cell array. When a set write operation is performed on a selected memory cell of the first memory cell array, a selected global bit line of the global bit lines is charged, and the selected memory cell is charged by applying a voltage charging the selected global bit line.

In an embodiment, the selected global bit line is charged when a transistor connecting the selected global bit line to a selected local bit line is turned off, and through turning on the transistor, the selected global bit line is electrically connected to the selected local bit line, so as to apply the set write voltage to the selected memory cell. In an embodiment, a clamping voltage for generating the set write voltage is applied to a gate of the transistor, and the voltage charging the selected global bit line is greater than the clamping voltage.

In view of the above, according to one or more embodiments of the disclosure, the memory cell array includes the first memory cell array with the RRAM structure and the second memory cell array with the NOR flash memory structure, and therefore the high integration level and the low power consumption may be achieved. Further, the set write operation is performed on the RRAM by applying the voltage charging the global bit lines, which may reduce the power consumption.

To make the above more comprehensible, several embodiments accompanied with drawings are described in detail as follows.

DESCRIPTION OF THE EMBODIMENTS

Embodiments of the disclosure are described in detail with reference to the drawings. The semiconductor storage device provided in one or more embodiments of the disclosure is to integrate a memory cell array having a NOR flash memory structure and a memory cell array having a RRAM structure onto one substrate.

Figure 1:
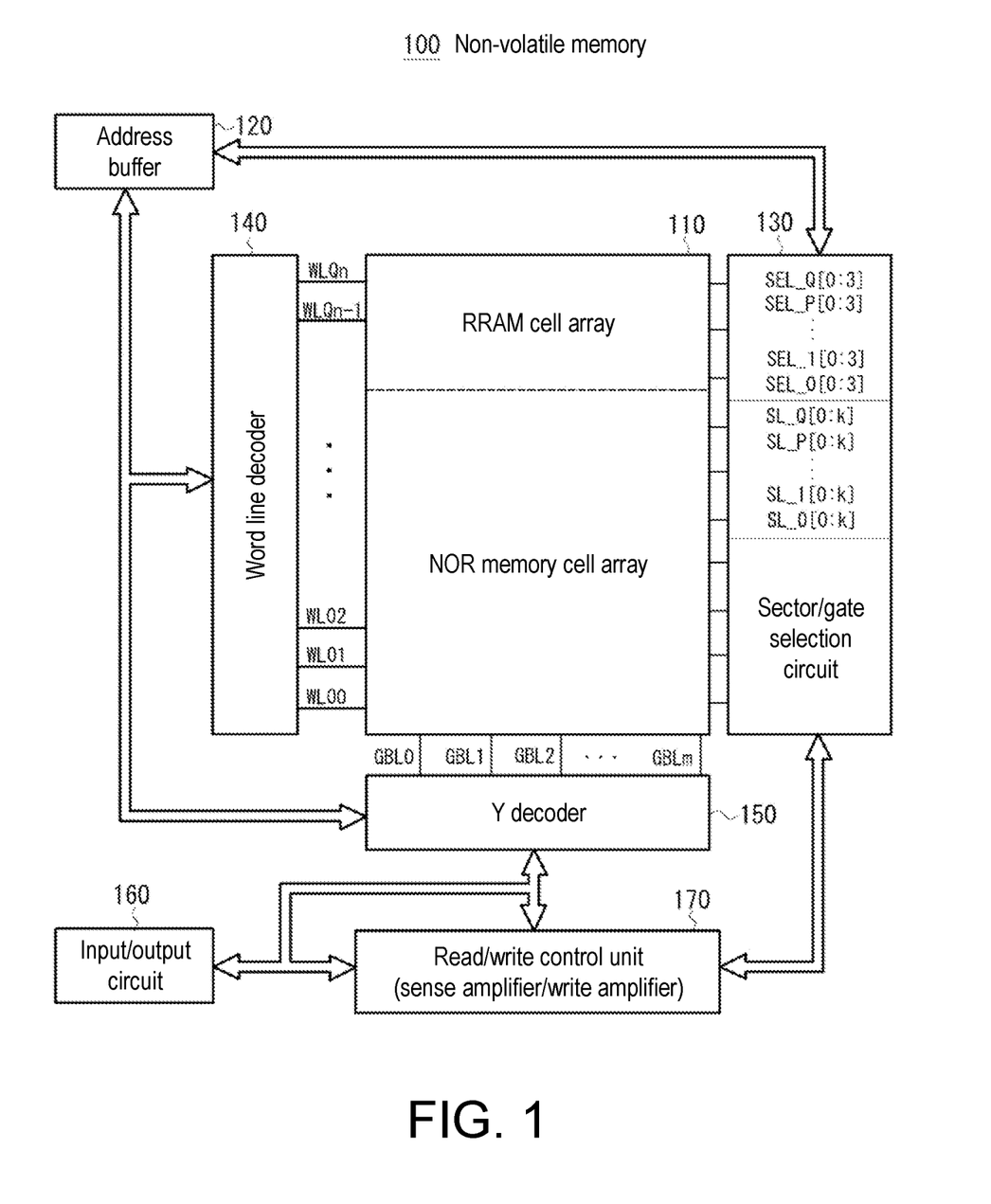
FIG. 1 illustrates an overall structure of a non-volatile memory according to an embodiment of the disclosure.

A non-volatile memory provided in an embodiment of the disclosure is elaborated hereinafter. FIG. 1 is a block diagram illustrating an overall structure of a non-volatile memory 100 according to an embodiment of the disclosure. As shown in FIG. 1, the non-volatile memory 100 is composed of a memory cell array 110, an address buffer 120, a sector/gate selection circuit 130, a word line decoder 140, a Y decoder 150, an input/output circuit 160, a read/write control unit 170, and other elements integrated onto a silicon substrate or the like. Each element may be connected through internal buses capable of receiving and sending address, data, control signals, and so on. The main structure is shown in FIG. 1, while a voltage generating circuit and the like are omitted.

The memory cell array 110 includes a memory cell array with a NOR flash memory structure (hereinafter referred to as a NOR array) 110A and a memory cell array with a RRAM structure (hereinafter referred to as a resistive random access array) 110B. Compared to the resistive random access array 110B, the NOR array 110A is capable of achieving the high integration level; compared to the NOR array 110A, the resistive random access array 100B is capable of achieving operation with low power consumption.

Figure 2A:
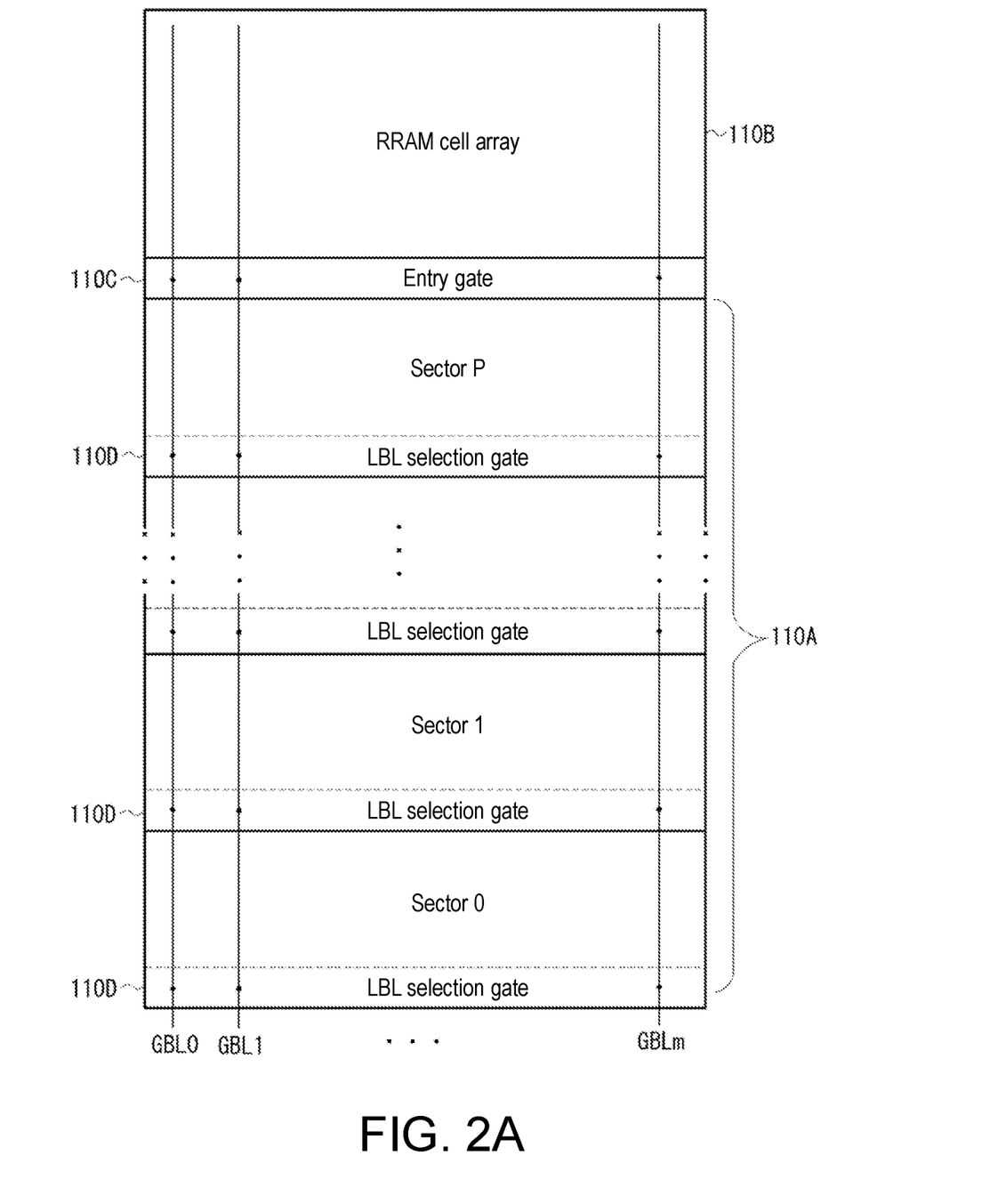
FIG. 2A and FIG. 2B are schematic views of a structure of a memory cell array according to an embodiment of the disclosure.

FIG. 2A is a schematic plan view of a structure of a memory cell array. The memory cell array 110 along a column direction includes the NOR array 110A and the resistive random access array 110B. Capacities of memories in the NOR array 110A and the resistive random access array 110B are not limited herein; for instance, the NOR array 110A is 16 MB, and the resistive random access array 110B is 1 MB.

The NOR-type array 110A includes a plurality of sectors (or blocks) 0, 1, . . . , and P acting as erase units along the column direction, and each sector includes an LBL selection gate 110D configured to select a local bit line LBL extending along the column direction within the sector. An entry gate 110C is formed between the last sector P of the NOR array 110A and the resistive random access array 110B. The entry gate 110C selects a local bit line extending along the column direction within the resistive random access array 110B; when the NOR array 110A is being accessed, the entry gate 110C separates the resistive random access array 110B from the NOR array 110A.

A plurality of global bit lines GBL0, GBL1, GBL2, . . . , and GBLm (referred to as global bit lines GBL in general) are formed along the column direction of the memory cell array 110. The global bit lines GBL are connected to the LBL selection gate 110D of each sector of the NOR array 110A and connected to the entry gate 110C; that is, the global bit lines GBL are shared by the NOR array 110A and the resistive random access array 110B.

Figure 2B:
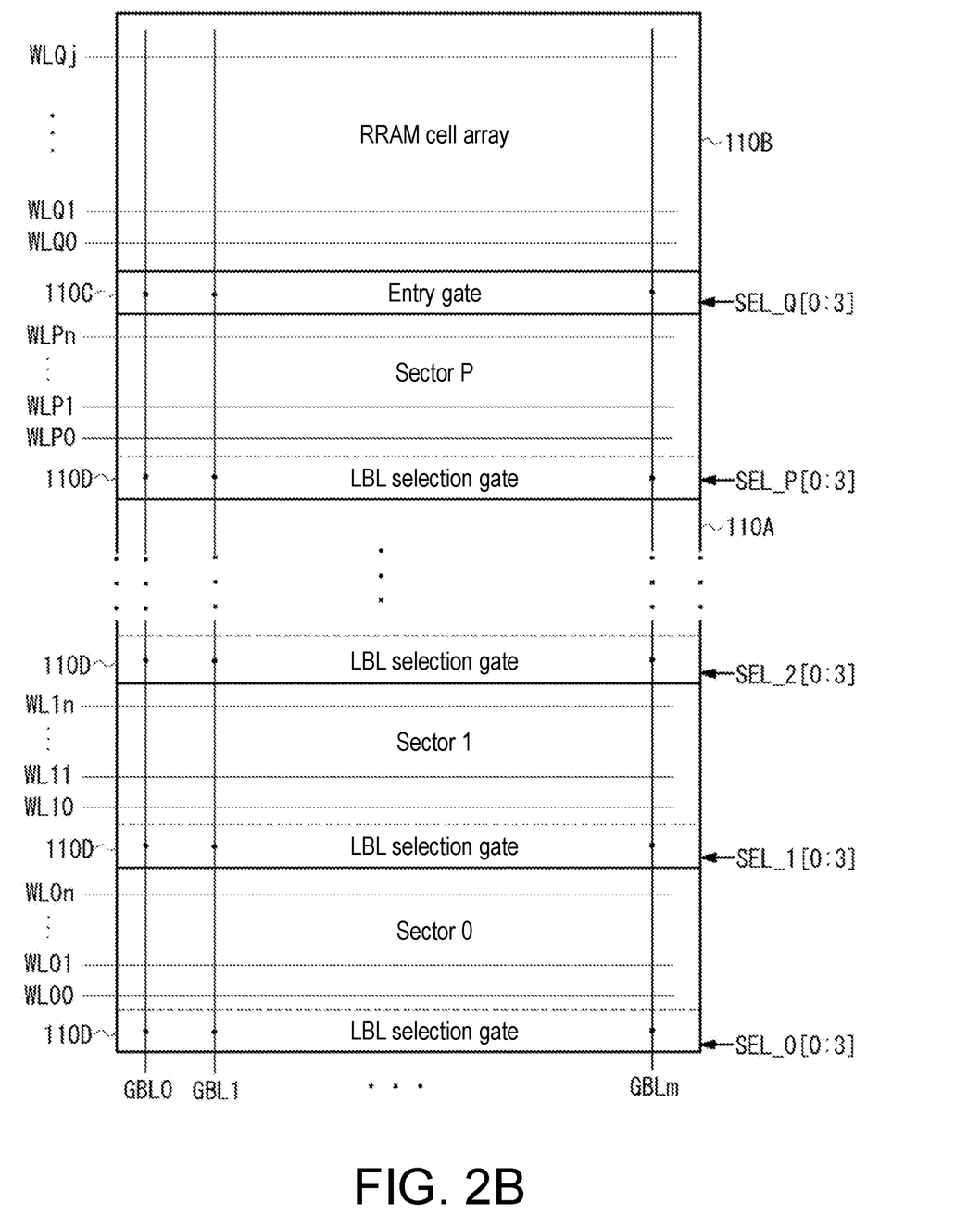

FIG. 2B is a plan view marking word lines and selection signal lines on the plan view of FIG. 2A. A plurality of word lines are formed along a row direction of the memory cell array 110. Word lines WL00 to WL0$n$ are formed along the row direction of the sector 0, and word lines WL10 to WL1$n$ are formed along the row direction of the sector 1; similarly, word lines WLP0 to WLPn are formed along the row direction of the sector P, and word lines WLQ0 to WLQj are formed along the row direction of the resistive random access array 110B.

A 4-bit selection signal line SEL_0[0:3] from the sector/gate selection circuit 130 is supplied to the LBL selection gate 110D of the sector 0, and a selection signal line SEL_1[0:3] is supplied to the LBL selection gate 110D of the sector 1; similarly, a selection signal line SEL_P[0:3] is supplied to the LBL selection gate 110D of the sector P, and a selection signal line SEL_Q[0:3] is supplied to the entry gate 110C. As described hereinafter, the sector/gate selection circuit 130 selects the sector of the NOR array 110A or the resistive random access array 110B through a portion of a row address (higher-order bit), the selection signal line is supplied to the LBL selection gate 110D corresponding to the selected sector or the selected resistive random access array 110B, or the selection signal line is supplied to the entry gate 110C.

Figure 3:
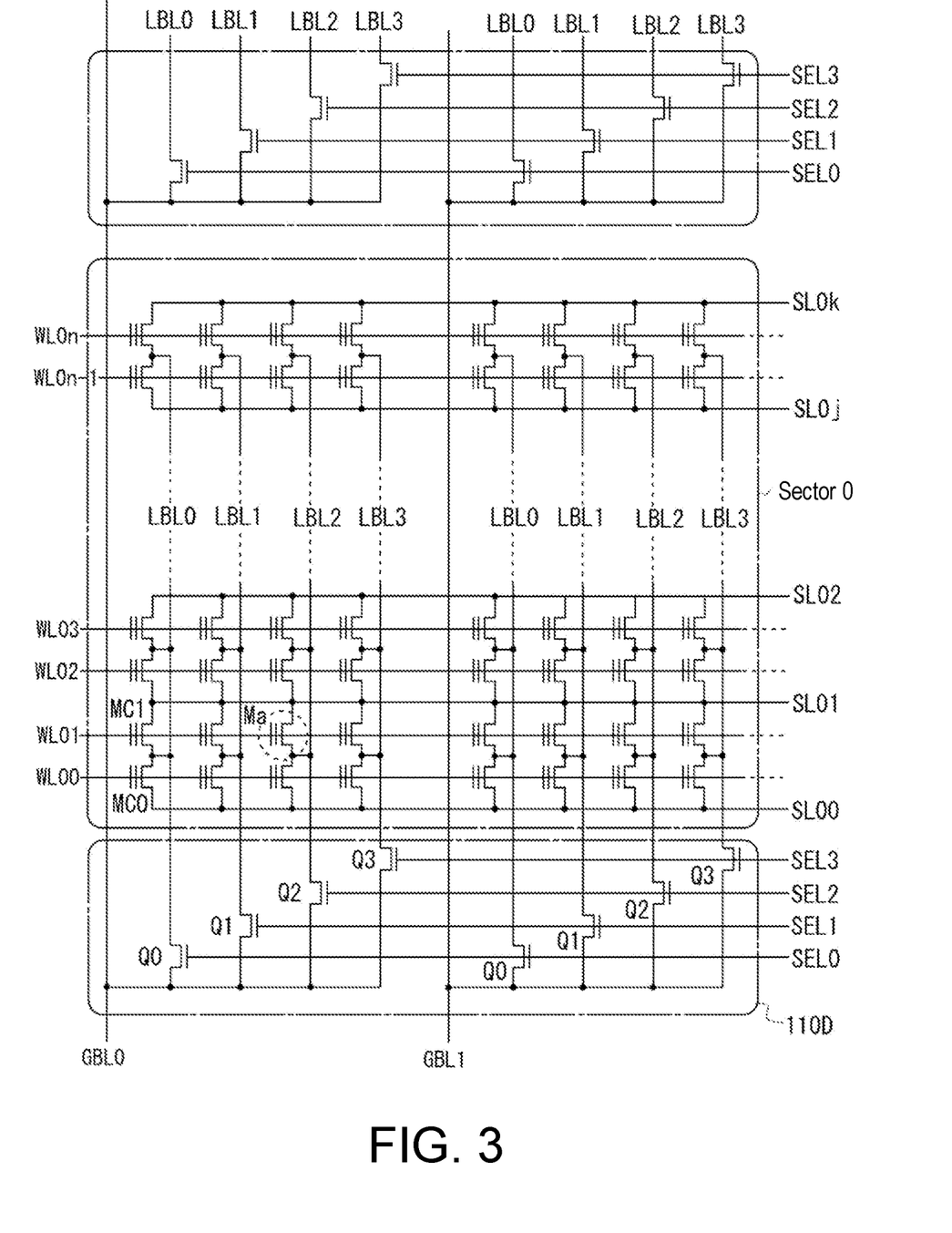
FIG. 3 is a partial circuit diagram of an NOR memory cell array according to an embodiment of the disclosure.
Figure 4:
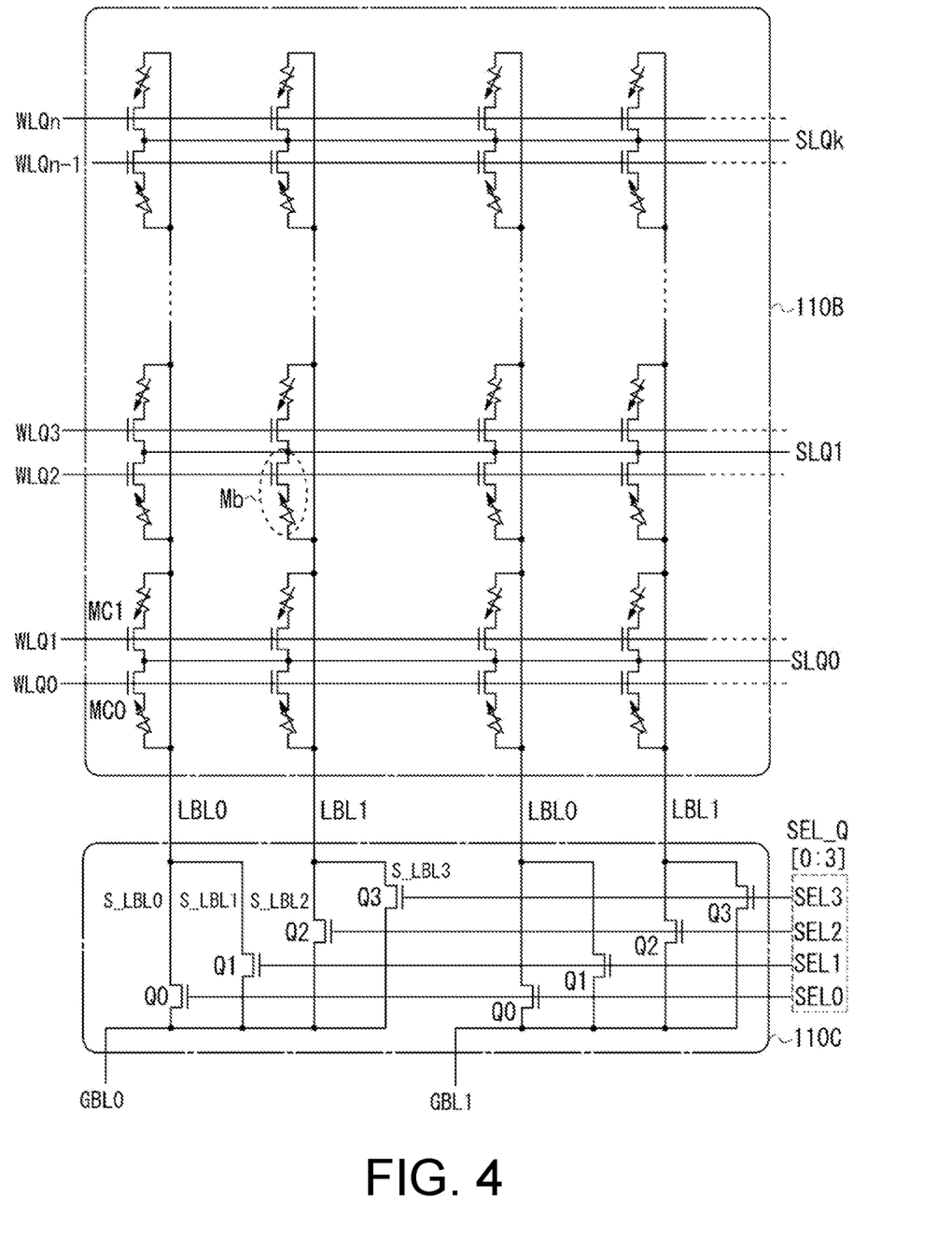
FIG. 4 is a partial circuit diagram of an RRAM according to an embodiment of the disclosure.

FIG. 3 shows a circuit structure of a portion of the sector 0, and FIG. 4 shows a circuit structure of a portion of the resistive random access array 110B and the entry gate 110C. As shown in FIG. 3, the LBL selection gate 110D extends along the row direction to divide one global bit line GBL into four local bit lines LBL0 to LBL3. That is, m global bit lines GBL are divided into m×4 local bit lines by the LBL selection gate 110D.

Four NMOS transistors Q0, Q1, Q2, and Q3 connected in parallel are formed between one global bit line GBL and four local bit lines LBL0 to LBL3. Each gate of the transistor Q0 is commonly connected to a selection signal line SEL0 extending along row direction, each gate of the transistor Q1 is commonly connected to a selection signal line SEL1 extending along row direction, each gate of the transistor Q2 is commonly connected to a selection signal line SEL2 extending along the row direction, and each gate of the transistor Q3 is commonly connected to a selection signal line SEL3 extending along the row direction.

The sector/gate selection circuit 130 selects the sector according to the higher-order bit of the row address, and the sector/gate selection circuit 130 drives any of the selection signal lines SEL_0[0:3] connected to the LBL selection gate 110D of the sector selected according to the column address to a high (H) level and drives the remaining selection signal lines to a low (L) level. For instance, the selection signal line SEL0 is driven to the H level, and the remaining selection signal lines SEL1 to SEL3 are driven to the L level, whereby m transistors Q0 of LBL selection gate 110D are turned on, and m global bit lines GBL are selectively connected to corresponding m local bit lines LBL0; on the other hand, the transistors Q1 to Q3 are turned off, and the local bit lines LBL1 to LBL3 are separated from the global bit line.

A plurality of memory cells are, in form of a matrix, formed in each sector. Drain regions of adjacent memory cells along the column direction are connected together, and the drain regions are connected to the local bit lines. Moreover, each gate of the memory cell in the row direction is commonly connected to the word line in the row direction, and each source region of the memory cell in the row direction is commonly connected to the source line in the row direction. For instance, the gates of the memory cells MC0 and MC1 are connected to the word lines WL00 and WL01, the common drain region of the memory cells MC0 and MC1 is connected to the local bit line LBL0, the source region of the memory cell MC0 is connected to the source line SL00, and the source region of the memory cell MC1 is connected to the source line SL01. The sector/gate selection circuit 130 selects the source line of the sector selected according to the column address and applies an operating voltage to the source line selected by the read/write control unit 170.

For instance, the memory cell includes an oxide-nitride-oxide (ONO) film which serves as an accumulation region configured to trap electric charges on the surface of the substrate and includes the gate (e.g., polysilicon or metal) on the ONO film. The memory cell may program data by, for instance, trapping hot electrons to the ONO film, and the hot electrons are generated when a current flows between the source/drain regions. However, in addition to the above, the electric charges may also be trapped to the ONO film by Fowler-Nordheim (FN) tunneling. The trapped electric charges may be erased by, for instance, FN tunneling or hot hole injection.

Figure 5:
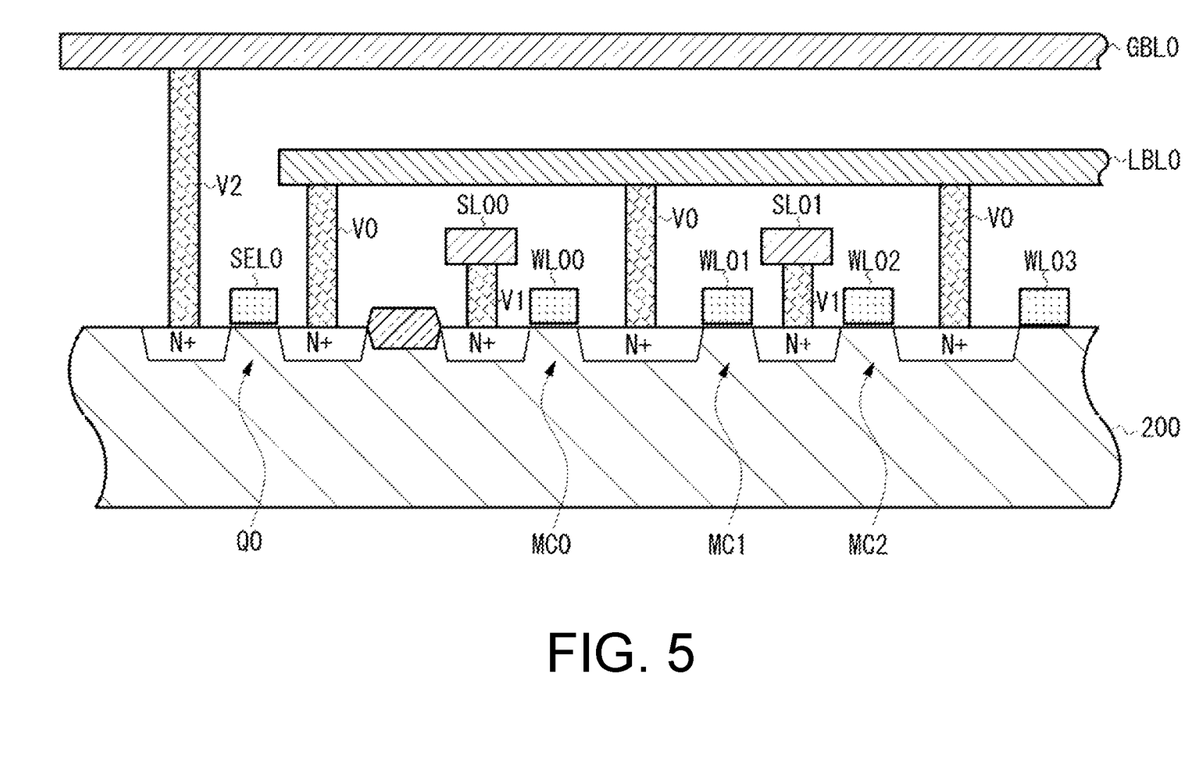
FIG. 5 is a partial cross-sectional view briefly illustrating an NOR memory cell array according to an embodiment of the disclosure.

FIG. 5 is a schematic cross-sectional view of the memory cells MC0 and MC1 in the column direction. In a p-type silicon substrate or a p-well region 200, the memory cells MC0 and MC1 are formed in an active region formed by a field oxidation film or trench isolation. The word lines WL00 and WL01 of the row direction are constituted at the gates of the memory cells MC0 and MC1. The drain regions of the memory cells MC0 and MC1 are shared by the memory cells MC0 and MC1, and the drain regions are electrically connected to the local bit line LBL0 of the column direction through a via contact V0. The source regions of the memory cells MC0 and MC1 are electrically connected to the source lines SL00 and SL01 of the row direction through a via contact V1. In this embodiment, the source line is formed by a conductive layer on a substrate, which should not be construed as a limitation in the disclosure, and the source line may also be formed by an embedded diffusion region in the substrate. At this time, the source regions of the memory cells in the row direction are connected together.

Besides, in the active region adjacent to the memory cell MC0, the transistor Q0 of the LBL selection gate 110D is formed. The selection signal line SEL0 of the row direction is constituted at the gate of the transistor Q0, the drain region is electrically connected to the global bit line GBL0 in the column direction through a via contact V2, and the source region is electrically connected to the local bit line LBL0 through the via contact V0.

The local bit lines LBL0 to LBL3 formed by the LBL selection gate 110D are connected to the common drain regions of the last memory cell WL0n−1 and the memory cell WL0n in the sector 0 and end here. The other sectors 1 to P are also constituted in the same manner as that of the sector 0.

Next, the entry gate 110C is explained. As shown in FIG. 2A and FIG. 2B, the entry gate 110C is formed on a border of the last sector P of the NOR array 110A and the resistive random access array 110B. The entry gate 110C is constituted by the transistors Q0 to Q3 whose gate width and gate length are the same as those of the transistors Q0 to Q3 of the LBL selection gate 110D are of the same size; different from the LBL selection gate 110D, the entry gate 110C is connected to the global bit line GBL by dividing one global bit line GBL into two local bit lines LBL0 and LBL1.

A partial circuit structure of the entry gate 110C and the resistive random access array 110B is shown in FIG. 4. The entry gate 110C includes the transistors Q0 to Q3 connected in parallel between one global bit line GBL and four sacrificial local bit lines S_LBL0 to S_LBL3. The selection signal line SEL_Q[0:3] from the sector/gate selection circuit 130 is connected to the gates of the transistors Q0 to Q3.

By disconnecting the sacrificial local bit line S_LBL0 and its adjacent sacrificial local bit line S_LBL1, the local bit line LBL0 is formed; by disconnecting the sacrificial local bit line S_LBL2 and the adjacent sacrificial local bit line S_LBL3, the local bit line LBL1 is formed.

Through this structure, the pitch between the local bit lines LBL0 and LBL1 of the resistive random access array 110B is twice the pitch between the local bit lines LBL0 and LBL1 and the pitch between the local bit lines LBL2 and LBL3 of the NOR array 110A. Moreover, at the entry gate 110C, there are two transistors connected in parallel in one local bit line, so that the current supplied by one local bit line of the resistive random access array 110B may be twice the current supplied by one local bit line of the NOR array 110A. The reason why the pitch between the local bit lines of the resistive random access array 110B is larger than that of the NOR array 110A lies in that it is difficult for the size of the RRAM cell to be smaller than the size of the NOR memory cell. Besides, the reason why the current supplied by the local bit line of the resistive random access array 110B is increased lies in that the maximum current flowing through the RRAM cell may, as compared to the maximum current flowing through the NOR memory cell (e.g., a tunneling hot electron current), almost reach the current supplied by the local bit line of the resistive random access array 110B.

In the resistive random access array 110B, a plurality of memory cells in form of a matrix are formed. One memory cell includes an access transistor and a resistive random access element. Each gate of the access transistor in the row direction is commonly connected to the word line in the row direction, the source regions of a pair of adjacent access transistors along the column direction are commonly connected to the corresponding source line, one of the electrodes of the resistive random access element is connected to the drain region of the access transistor, and the other electrode of the resistive random access element is connected to the local bit line. For instance, the gates of the memory cells MC0 and MC1 are connected to the word lines WLQ0 and WLQ1, the common source region of the memory cells MC0 and MC1 is connected to the source line SLQ0, the drain region of the memory cell MC0 is connected to the local bit line LBL0 via the resistive random access element, and the drain region of the memory cell MC1 is connected to the local bit line LBL0 via the resistive random access element.

The resistive random access element includes, for instance, thin film oxide containing hafnium oxide (HfOx) or other transition metals and is set or reset according to the polarity and the value of a write pulse voltage. The resistive random access element, for instance, is set to a low resistance state (LRS) when the current flows from the bit line to the source line and reset to a high resistance state (HRS) when the current flows from the source line to the bit line.

Figure 6:
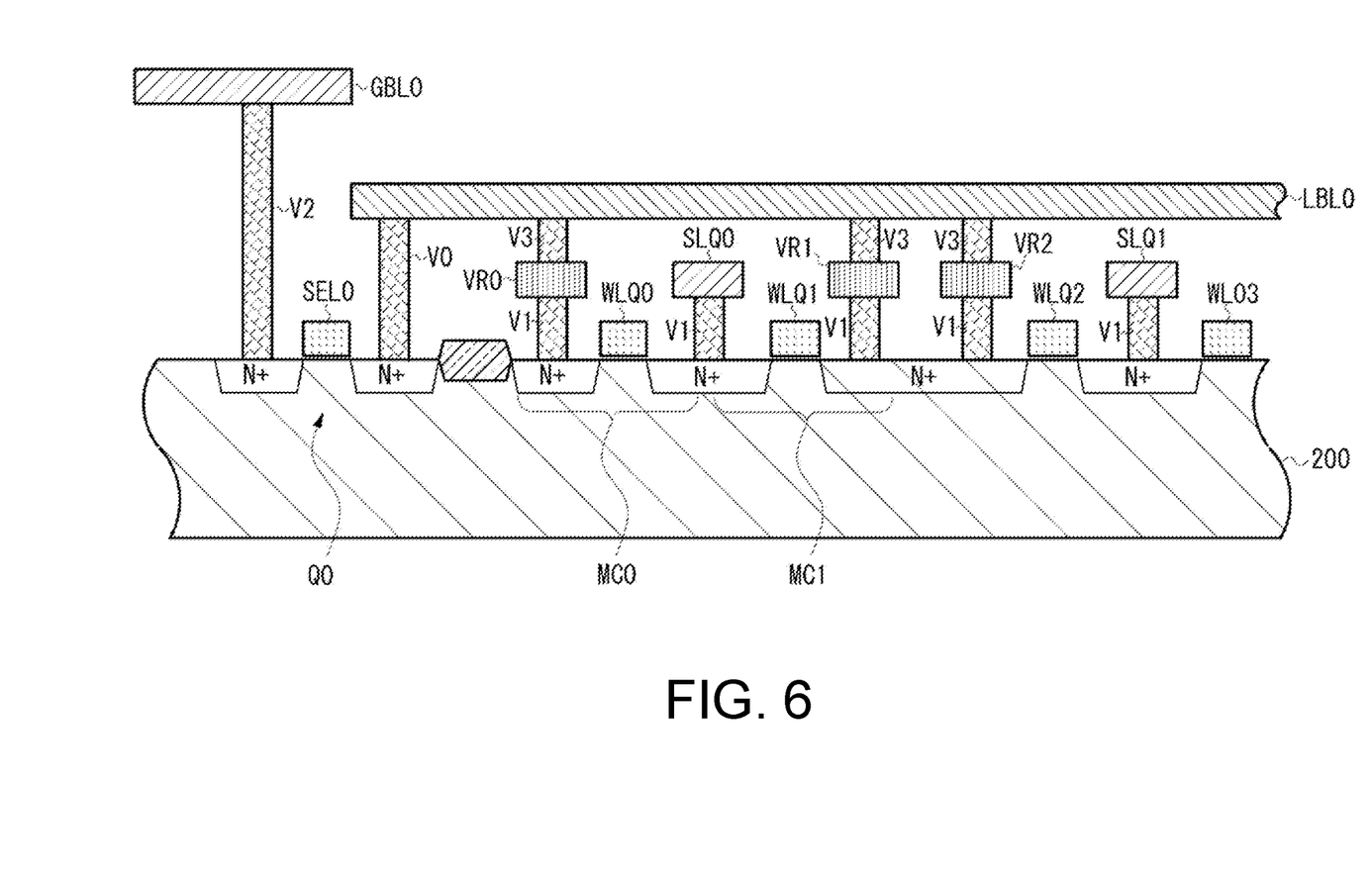
FIG. 6 is a partial cross-sectional view briefly illustrating an RRAM cell array according to an embodiment of the disclosure.

FIG. 6 is a schematic cross-sectional view of the memory cells MC0 and MC1 in the column direction. In a p-type silicon substrate or a p-well region 200, the memory cells MC0 and MC1 are formed in an active region formed by a field oxidation film or trench isolation. The word lines WL00 and WL01 of the row direction are constituted at the gates of the access transistors of the memory cells MC0 and MC1, and the common source region of the access transistors is electrically connected to the source line SLQ0 of the row direction through the via contact V1. The drain region of the access transistor of the memory cell MC0 is connected to the resistive random access element VR0 via the via contact V1, and further the resistive random access element VR0 is electrically connected to the local bit line LBL0 of the column direction via the via contact V3. The drain region of the access transistor of the memory cell MC1 is connected to the resistive random access element VR1 via the via contact V1, and further the resistive random access element VR1 is electrically connected to the local bit line LBL0 via the via contact V3.

In the active region adjacent to the memory cell MC0, the transistor Q0 having the entry gate 110C is formed. The gate of the transistor Q0 constitutes the selection signal line SEL0 of the row direction, the drain region is electrically connected to the global bit line GBL0 via the via contact V2, and the source region is electrically connected to the local bit line LBL0 via the via contact V0.

The memory cell array 110 is formed with a multi-layer wiring structure; however, as shown in FIG. 5 and FIG. 6, it may be understood that the resistive random access array 110B and the entry gate 110C are compatible with the NOR array 110A.

With reference to FIG. 1 again, the address buffer 120 receives an address from an address bus not shown in FIG. 1, and provides the received row and column addresses to the sector/gate selection circuit 130 and the Y decoder 150. The sector/gate selection circuit 130 selects the sector or the entry gate 110C based on the column address and drives the selection signal lines SEL0 to SEL3 of the entry gate 110C or the sector selected based on the column address to the H level or the L level. Further, the sector/gate selection circuit 130 applies the operating voltage to the source line of the resistive random access array 110B or the sector selected according to the column address. The operating voltage is controlled by the read/write control unit 170.

The Y decoder 150 selects the global bit lines GBL0 to GBLm based on the column address. According to the control of the read/write control unit 170, a readout voltage, a program voltage, an erase voltage, and so on are applied to the selected global bit lines GBL.

The word line decoder 140 receives the row address from the address buffer 120 and selects the word line WL based on the decoding result of the received row address. According to the control of the read/write control unit 170, the readout voltage, the program (write) voltage, the erase voltage, and so on are applied to the selected word line. In addition, when all the data of the memory cells in the sector of the NOR array 110A are erased, all the word lines in the sector are selected.

The input/output circuit 160 outputs the data read from the memory cell array 110 to an external terminal or writes the data received from the external terminal to the memory cells. Further, the address received from the external terminal is provided to the address buffer 120, and an instruction is provided to the read/write control unit 170.

The read/write control unit 170 includes, for instance, a state machine or a micro-controller, a sense amplifier S/A, a write amplifier W/A, and the like, and the read/write control unit 170 controls the entire operation of the non-volatile memory 100. The read/write control unit 170 interprets the instruction received from the input/output circuit 160 and performs read, write, and erase operations based on the interpreted result.

The read/write control unit 170 may also control the read and write operations of the resistive random access array 110B according to the instruction provided to the NOR flash memory. However, the RRAM does not contain the concept of the erase operation; hence, the read/write control unit 170 recognizes the access to the resistive random access array 110B from the row address, and when an erase instruction is received, the resistive random access array 110B performs a data rewrite operation to change the data of all memory to "1". Certainly, a user may separate the instruction executed when the NOR array 110A is being accessed from the instruction executed when the resistive random access array 110B is being accessed for input into the non-volatile memory 100.

Next, the operation of the non-volatile memory 100 provided in this embodiment is explained.

Readout action: When a readout instruction and an address are input from the external terminal, the word line decoder 140 selects the word line according to the row address, the sector/gate selection circuit 130 selects the sector or the entry gate 110C based on the row address, the selection signal lines SEL0 to SEL3 of the LBL selection gate 110D of the selected sector or the selection signal lines SEL0 to SEL3 of the entry gate 110C are driven, and a source SL is selected according to the column address. The Y decoder 150 selects the global bit line according to the column address. While the NOR array 110A is being accessed, the sector/gate selection circuit 130 sets the entry gate 110C as being unselected (the selection signal lines SEL0 to selection signal line SEL3 are all at the L level), so that the resistive random access array 110B is separated from the NOR array 110A.

For instance, if the memory cell Ma shown in FIG. 3 is selected, the readout voltage is applied to the selected word line WL01, and the ground voltage GND is supplied to the source line SL01. Besides, the LBL selection gate 110D drives the selection signal line SEL2 to the H level and turns on the transistor Q2, the Y decoder 150 selects the global bit line GBL0, and the read/write control unit 170 applies the readout voltage to the global bit line GBL0. The memory cell Ma is turned on/off by a threshold corresponding to the stored data, and the sense amplifier senses the voltage or the current of the global bit line GBL0.

In addition, if the memory cell Mb shown in FIG. 4 is selected, the readout voltage is applied to the selected word line WLQ1, the access transistor is turned on, and the ground voltage GND is supplied to the source line SLQ0 selected by the sector/gate selection circuit 130. Besides, the sector/gate selection circuit 130 drives the selection signal line SEL2 of the entry gate 110C to the H level and turns on the transistor Q2, the Y decoder 150 selects the global bit line GBL0, and the read/write control unit 170 applies the readout voltage to the global bit line GBL0. According to whether the resistive random access element is at the LRS or the HRS, the current flowing from global bit line GBL0 to the source line SLQ0 is different, and the voltage or the current is sensed by the sense amplifier.

Write action: When the read/write control unit 170 writes data "0" to the memory cell Ma of the NOR array 110A, the write voltage is applied to the selected word line WL02, the write voltage is applied to the selected global bit line GBL0, and the ground voltage GND is applied to the selected source line SL01. On the other hand, when data "0" are written to the memory cell Mb of the resistive random access array 110B, the write voltage is applied to the selected word line WLQ2 to turn on the access transistor, the write voltage is applied to the selected global bit line GBL0, and the ground voltage GND is applied to the selected source line SLQ1. In addition, the details of the write operation performed on the resistive random access array 110B are explained later.

Erase operation: while the sector of the NOR array 110A is being erased, all word lines in the sector are selected, and the ground voltage GND is applied to the selected word line. Besides, the sector/gate selection circuit 130 turns off all the transistors Q0 to Q3 of the selected LBL selection gate 110D, sets the local bit lines LBL0 to LBL3 to be in a floating state, and applies an erase voltage to all source lines in the selected sector. As a result, a high voltage is applied between the gates and the source regions of all memory cells in the sector, electrons in the memory cells escape to the sources, the thresholds of the memory cells drop, and the data become "1".

On the other hand, when the address is the resistive random access array 110B, the word line decoder 140 selects all word lines of the resistive random access array 110B and turns on all access transistors. The entry gate 110C turns on all of the transistors Q0 to Q3 and connects all of the local bit lines LBL0 and LBL1 to the global bit line GBL. The read/write control unit 170 applies the ground voltage GND to the global bit line GBL which should write the data "1" to all the resistive random access elements, and the sector/gate selection circuit 130 applies the write voltage to the source lines SLQ1 to SLQk.

Thereby, according to this embodiment, given the NOR array 110A and the resistive random access array 110B are integrated onto the memory cell array 110, by setting the entry gate 110C at the border between the NOR array 110A and the resistive random access array 110B, a stress resulting from an undesired voltage may be prevented from affecting the resistive random access array 110B via the global bit line GBL or the like while the NOR array 110A is in operation.

Moreover, by integrating the NOR array 110A and the resistive random access array 110B, both the advantage of high integration resulting from the NOR array 110A and the advantage of low power operation resulting from the resistive random access array 110B may be obtained.

In the embodiment, the LBL selection gate 110D divides one global bit line into four local bit lines, which is merely exemplary, and the number of the local bit lines divided from one global bit line may be any number. Besides, the pitch between the local bit lines divided by the entry gate 110C is set to be twice the pitch between the local bit lines divided by the LBL selection gate 110D, which is merely exemplary, as long as the pitch between the local bit lines divided by the entry gate 110C is greater than the pitch between the local bit lines divided by the LBL selection gate 110D. Further, the size of the transistor at the entry gate 110C is made equal to the size of the transistor at the LBL selection gate, which is merely exemplary, and the gate width of the transistor at the entry gate 110C may be greater than the gate width of the transistor at the LBL selection gate 110D.

Next, the write operation of the resistive random access array 110B provided in this embodiment is explained. The resistive random access element of the RRAM includes, for instance, thin film oxide containing HfOx or other transition metals and is set or reset according to the polarity and the value of the write pulse voltage. When a set write pulse is applied, a current path like a filament is formed between the electrodes of the resistive random access element, and the resistive random access element is changed to the LRS. On the other hand, when a reset write pulse of a different polarity is applied, the filament between the electrodes of the resistive random access element is broken or reduced, and the resistive random access element is changed to the HRS.

According to the characteristics of the running current of the resistive random access element, it is known that when the resistive random access element is set, if the time of applying the set write pulse is prolonged, the current excessively flows through the resistive random access element, and the resistive random access element is returned to a reset mode. The reason lies in that the filament is broken due to the continuous current flow through the filament between the electrodes. Therefore, ideally, the application of the set write voltage is expected to stop immediately as soon as the resistive random access element is set. In the case of resetting the resistive random access element, if the reset write voltage is continuously applied after the reset, it may sometimes return to the set state. Therefore, the application of the reset write voltage is expected to stop immediately as soon as the resistive random access element is reset.

In the existing set write operation, the set write pulse voltage with a predetermined pulse width is applied to the local bit line, but it is not easy to ensure the consistency of the pulse width when the resistive random access element is changed to the LRS. Therefore, in this embodiment, instead of applying the set write pulse voltage as in the related art, the selected global bit line is charged with a voltage during a preset operation of the set operation, and in the subsequent set operation, the voltage charged to the selected global bit line is applied to perform the set write operation on the resistive random access element.

Figure 7:
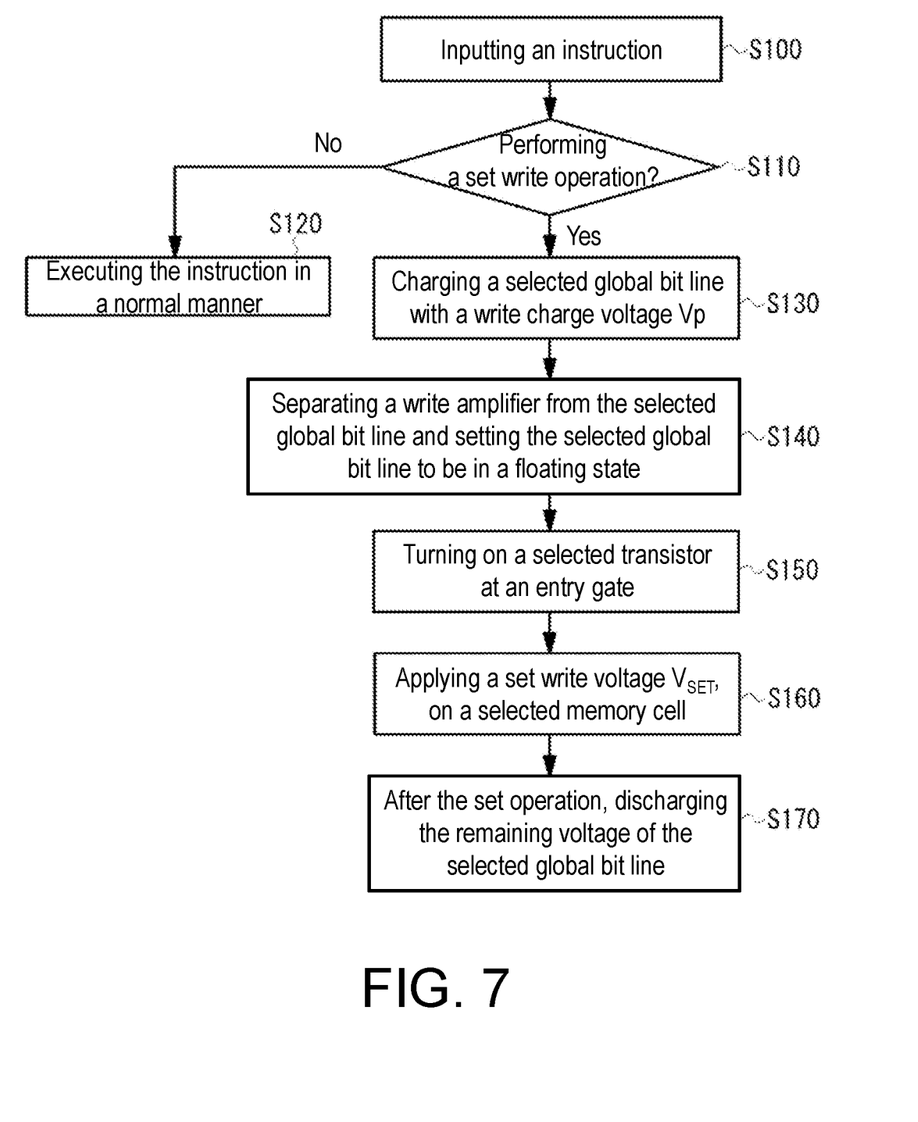
FIG. 7 is a flowchart illustrating a write operation of an RRAM according to an embodiment of the disclosure.

FIG. 7 is a flowchart illustrating a write operation of an RRAM according to an embodiment of the disclosure. When the read/write control unit 170 receives an external instruction (S100), it is determined whether the instruction is to perform a set write operation on the resistive random access array 110B (S110). If it is an instruction other than performing the set write operation, the read/write control unit 170 executes the instruction in a normal manner (S120).

If the instruction is to perform the set write operation, the read/write control unit 170 charges the selected global bit line GBL with a write charge voltage Vp from the write amplifier (W/A) as a preset operation (S130). At this time, all the transistors Q0 to Q3 of the entry gate 110C and the LBL selection gate 110D are turned off, and the selected global bit line GBL is separated from the resistive random access array 110B and the NOR array 110A.

A write amplifier is connected to one end of each of the global bit lines GBL, and the write amplifier provides the write charge voltage Vp to the selected global bit line GBL for a certain period of time and charges the selected global bit line GBL with the write charge voltage Vp (a voltage $V_{GBL}$ of the global bit line=Vp). The voltage $V_{GBL}$ (=Vp) of the selected global bit line GBL is greater than a set write voltage $V_{SET}$ applied to the resistive random access element. By integrating the NOR array 110A and the resistive random access array 110B along the column direction of the memory cell array 110, the wiring length of the global bit line GBL in the column direction increases, and the capacitance increases accordingly. Therefore, the global bit line GBL may be charged by the power sufficient to perform the set write operation on the resistive random access element.

After the selected global bit line GBL is charged, the read/write control unit 170 separates the write amplifier from the selected global bit line GBL (e.g., by turning off the transistor connected between the write amplifier and the global bit line), so that the selected global bit line GBL is changed to be in a floating state (S140). As such, the voltage $V_{GBL}$ charging the selected global bit line GBL then serves as the current source for performing the set write operation.

Next, the read/write control unit 170 turns on the selected transistor at the entry gate 110C (S150) and electrically connects the selected global bit line GBL to the selected local bit line LBL. At this time, the set write voltage $V_{SET}$+Vth (the threshold value of the transistor) is applied to the gate of the selected transistor, and the transistor has a cramped function of generating the set write voltage $V_{SET}$. As a result, a voltage $V_{LBL}$ of the local bit line LBL is equal to the set write voltage $V_{SET}$.

On the other hand, the word line decoder 140 applies a write voltage to the selected word line WL to turn on the access transistor of the selected memory cell, and the sector/gate selection circuit 130 provides the ground voltage GND to the selected source line corresponding to the selected memory cell. Thereby, the set write voltage ($V_{LBL}=V_{SET}$) is applied to the resistive random access element of the selected memory cell as a bias voltage. The resistive random access element is transformed from the HRS to the LRS through the set write voltage $V_{SET}$, and the set write operation ends (S160). When the resistive random access element is changed to the LRS, the remaining voltage of the selected global bit line GBL is instantly discharged to the selected source line through the resistive random access element in the LRS (S170).

As such, in response to the transformation of the resistive random access element to the LRS, the voltage charging the selected global bit line GBL is autonomously discharged; therefore, after the setting of the resistive random access element, the issue of the current excessively flowing through the resistive random access element at the time of writing the pulse may be prevented. As a result, the current flowing through the set resistive random access element may be reduced, thereby improving the reliability of the set write operation. At the same time, the unnecessary current consumption during the set write operation may be suppressed.

Figure 8:
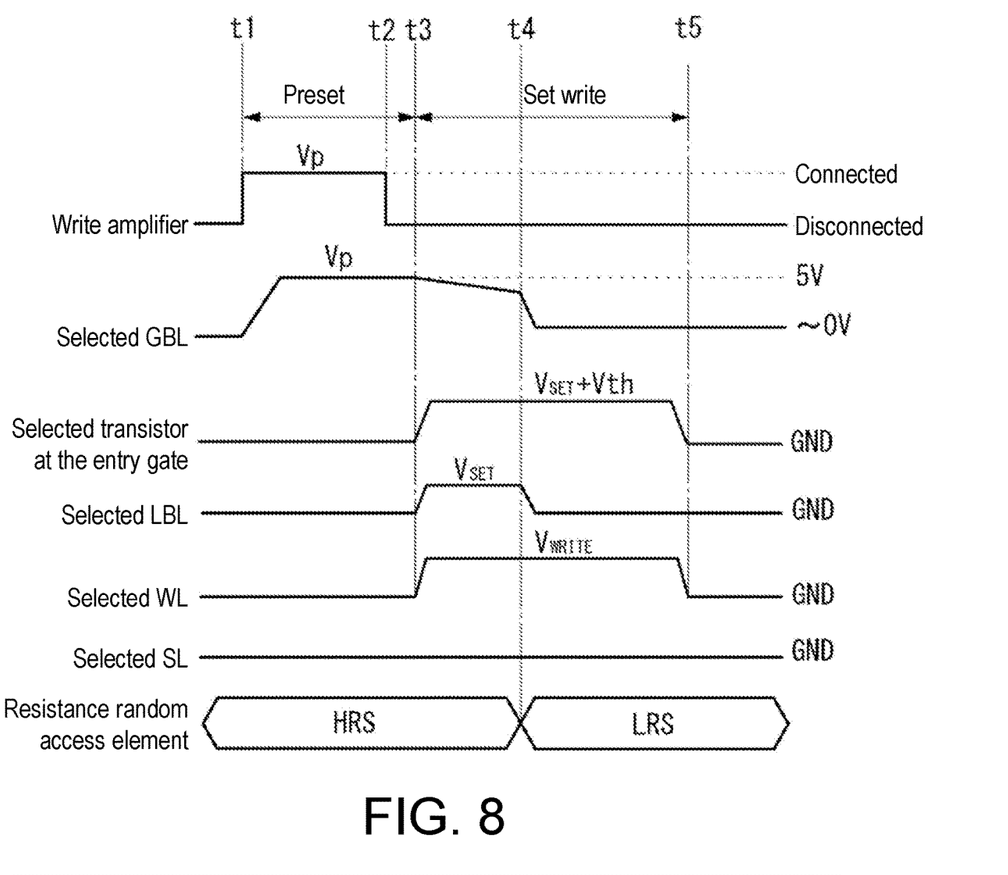
FIG. 8 illustrates operation waveform examples of each portion of the RRAM according to an embodiment of the disclosure.
Figure 9:
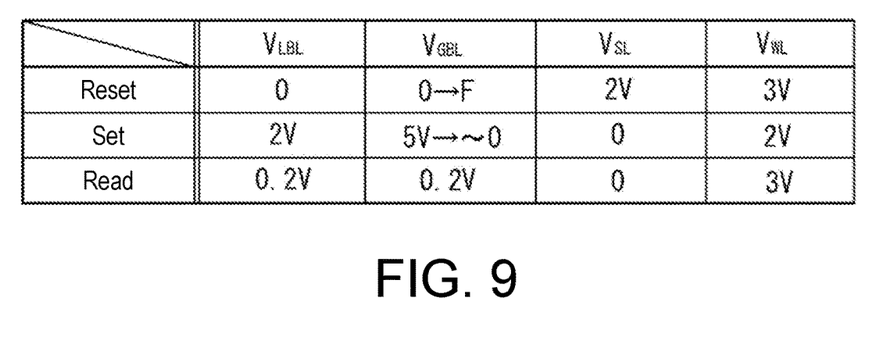
FIG. 9 is a table of an example of a bias voltage during an operation of a RRAM according to an embodiment of the disclosure.

Next, when the set write operation is being performed on the selected memory cell Mb shown in FIG. 4, the operation waveform examples of each portion of the RRAM are shown in FIG. 8. FIG. 9 shows an example of the bias voltage during each operation of the RRAM ($V_{LBL}$=the voltage of the selected local bit line LBL, $V_{GBL}$=the voltage of the selected global bit line GBL, $V_{SL}$=the voltage of the selected source line SL, and $V_{WL}$=the voltage of the selected word line).

In FIG. 8, time t1 to t2 is a preset period, and time t3 to t5 is a set write period. The write amplifier of the read/write control unit 170 charges the selected global bit line GBL0 with the write charge voltage Vp during the period from time t1 to t2. The write charge voltage Vp is, for instance, 5V.

Next, at the time t2, the read/write control unit 170 turns off the write amplifier from the selected global bit line GBL0, so that the selected global bit line GBL0 is changed to be in a floating state.

Next, at the time t3, the read/write control unit 170 turns on the transistor Q2 at the entry gate 110C. The set write voltage $V_{SET}$+Vth is applied to the gate of the transistor Q2. The set write voltage $V_{SET}$ is, for instance, 2V. Thereby, the set write voltage $V_{SET}$ is provided as the voltage $V_{LBL}$ of the local bit line LBL1. On the other hand, the write voltage $V_{WRITE}$ is provided to the selected word line WLQ2 as the voltage $V_{WL}$ of the selected word line, and the access transistor of the selected memory cell Mb is turned on. The write pulse voltage $V_{WRITE}$ is, for instance, 2V. The ground voltage GND is applied to the unselected word lines, and the access transistors of the unselected memory cells are turned off. Besides, the ground voltage GND is applied as the voltage $V_{SL}$ of the selected source line SLQ1. The unselected source lines are floated.

As such, the bias voltage of the set write voltage $V_{SET}$ is applied to the resistive random access element of the selected memory cell Mb. The resistive random access element where the bias voltage is applied is transformed from the HRS to the LRS at the time t4. Since the resistive random access element is transformed to the LRS, the remaining voltage of the selected global bit line GBL0 is discharged to the selected source line SLQ1 through the local bit line LBL1, the resistive random access element, and the access transistor. Thereafter, at the time t5, the voltage $V_{WL}$ of the selected word line WLQ2 becomes the ground voltage GND, and the set write operation ends. The time required for performing the set write operation on the selected memory cell Mb is, including the preset operation, about 100 ns or less.

In the reset write operation on the selected memory cell Mb, the ground voltage GND is supplied to the selected global bit line GBL0 as a default voltage. In the subsequent reset write operation, the transistor Q2 at the entry gate 110C is turned on, and the local bit line LBL1 is changed to be at the level of the ground voltage GND. The write voltage VR WRITE (e.g., 3V) is applied to the select word line WLQ2, and the reset write voltage VRESET (e.g., 2V) is applied to the selected source line SLQ1 as the source voltage $V_{SL}$.

Thereby, in the resistive random access element of the selected memory cell Mb, the current flows toward the selected global bit line GBL0 from the selected source line SLQ1, and the resistive random access element is transformed from the LRS to the HRS. When the resistive random access element is transformed to the HRS, the voltage $V_{LBL}$ of the local bit line LBL1 is reduced to the GND level, the transistor Q2 is not being turned on, and the selected global bit line GBL0 becomes floating. The time required for the reset write operation on the selected memory cell Mb is, including the preset operation, about 100 ns or less as well. As such, the reset write operation may also end autonomously in response to the transformation of the resistive random access element to the HRS.

In this way, according to the writing method provided in this embodiment, since the global bit line is charged with a voltage, and the set write operation is performed with said voltage applied for charging, the time during which the set write operation is performed may be controlled autonomously, and the reliability of the set write operation may be improved. Besides, in the case of using an electric charge pump to provide an external voltage to generate an expected internal voltage, the unnecessary operation of the electric charge pump may be expected to be prevented to an extent, which leads to a possible increase in the number of bits of one set/reset write operation.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A semiconductor storage device, comprising:
a memory cell array, having a first memory cell array with a resistive random access memory structure and a second memory cell array with a NOR flash memory structure on one substrate;
a plurality of global bit lines, extending along a column direction of the memory cell array and shared by the first memory cell array and the second memory cell array; and
a read/write control unit, performing a read/write operation on a selected memory cell in the first memory cell array or the second memory cell array,
wherein the read/write control unit applies a set write voltage to the selected memory cell in the first memory cell array by applying a voltage charging the global bit lines.

2. The semiconductor storage device according to claim 1, further comprising a connection member selectively connecting the global bit lines to the first memory cell array at a border of the first memory cell array and the second memory cell array, and the connection member applies the set write voltage to the selected memory cell in the first memory cell array based on the voltage charging the selected global bit line.

3. The semiconductor storage device according to claim 2, wherein the read/write control unit enables the selected global bit line to be in a floating state after charging the selected global bit line, and the connection member electrically connects the selected global bit line in the floating state to a local bit line.

4. The semiconductor storage device according to claim 3, wherein the connection member comprises a plurality of transistors connecting one of the global bit lines to a plurality of local bit lines, respectively, the connection member connects the selected global bit line to a selected local bit line of the local bit lines by turning on a selected transistor of the transistors, and the selected transistor generates the set write voltage.

5. The semiconductor storage device according to claim 4, wherein a clamping voltage for generating the set write voltage is applied to a gate of the selected transistor, and the voltage charging the selected global bit line is greater than the clamping voltage.

6. The semiconductor storage device according to claim 1, wherein the memory cell comprises a resistive random access element and an access transistor connected to the resistive random access element, a gate of the access transistor is connected to a word line, and when the access transistor is turned on, the set write voltage is applied to the resistive random access element.

7. The semiconductor storage device according to claim 1, wherein when the read/write control unit performs a reset write operation on the selected memory cell in the first memory cell array, a reset write voltage is applied to a source line, and a ground voltage is applied to the selected global bit line.

8. A writing method of a semiconductor storage device, the semiconductor storage device comprising:
a memory cell array, having a first memory cell array with a resistive random access memory structure and a second memory cell array with a NOR flash memory structure, the first memory cell array and the second memory cell array being formed on one substrate; and
a plurality of global bit lines, extending along a column direction of the memory cell array and shared by the first memory cell array and the second memory cell array,
when a set write operation is performed on a selected memory cell of the first memory cell array, charging a selected global bit line of the global bit lines and charging the selected memory cell in the first memory cell array by applying a voltage charging the selected global bit line.

9. The writing method according to claim 8, wherein the selected global bit line is charged when a transistor connecting the selected global bit line to a selected local bit line is turned off, and through turning on the transistor, the selected global bit line is electrically connected to the selected local bit line, so as to apply the set write voltage to the selected memory cell in the first memory cell array.

10. The writing method according to claim 9, wherein a clamping voltage for generating the set write voltage is applied to a gate of the transistor, and the voltage charging the selected global bit line is greater than the clamping voltage.

11. The writing method according to claim 8, wherein the semiconductor storage device comprises a connection member selectively connecting the global bit lines to the first memory cell array at a border of the first memory cell array and the second memory cell array, the writing method comprising:
controlling the connection member to apply the set write voltage to the selected memory cell in the first memory cell array based on the voltage charging the selected global bit line.

12. The writing method according to claim 11, comprising:
enabling the selected global bit line to be in a floating state after charging the selected global bit line, and
controlling the connection member to electrically connect the selected global bit line in the floating state to a local bit line.

13. The writing method according to claim 12, wherein the connection member comprises a plurality of transistors connecting one of the global bit lines to a plurality of local bit lines.

14. The writing method according to claim 8, wherein the memory cell comprises a resistive random access element and an access transistor connected to the resistive random access element, a gate of the access transistor is connected to a word line, the writing method comprising:
when the access transistor is turned on, applying the set write voltage to the resistive random access element.

15. The writing method according to claim 8, comprising:
wherein when the read/write control unit performs a reset write operation on the selected memory cell in the first memory cell array, applying a reset write voltage to a source line, and applying a ground voltage to the selected global bit line.

16. The semiconductor storage device according to claim 1, comprising:
an address buffer;
a word line decoder, receives a row address from the address buffer and selects a word line based on a decoding result of the received row address; and
a Y decoder, receives a column address from the address buffer and selects a global bit line based on the column address.

17. The semiconductor storage device according to claim 16, comprising:
a sector/gate selection circuit, receives the row address from the address buffer and selects a sector of the second memory cell array or the first memory cell array based on the row address.

18. The semiconductor storage device according to claim 17, wherein the sector/gate selection circuit separates the first memory cell array from the second memory cell array when the second memory cell array is being accessed.

19. The semiconductor storage device according to claim 18, further comprising a connection member selectively connecting the global bit lines to the first memory cell array at a border of the first memory cell array and the second memory cell array, the sector/gate selection circuit controls the connection member to separate the first memory cell array from the second memory cell array when the second memory cell array is being accessed.

20. The semiconductor storage device according to claim 4, wherein the plurality of transistors are connected to the global bit lines by dividing one global bit line into two local bit lines.

21. The semiconductor storage device according to claim 20, wherein a pitch between two adjacent local bit lines of the first memory cell array is twice a pitch between two adjacent local bit lines of the second memory cell array.

22. The semiconductor storage device according to claim 21, wherein a current supplied by one local bit line of the first memory cell array is twice a current supplied by one local bit line of the second memory cell array.

23. The semiconductor storage device according to claim 4, wherein when the second memory cell array is being accessed, the plurality of transistors enters a turn off state to separate the first memory cell array from the second memory cell array.

* * * * *